US011226550B2

(12) United States Patent
Wang et al.

(10) Patent No.: US 11,226,550 B2
(45) Date of Patent: Jan. 18, 2022

(54) MASK PLATE, METHOD FOR FORMING VIA-HOLE, METHOD FOR FORMING DISPLAY SUBSTRATE, THE DISPLAY SUBSTRATE, AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Xiaoyuan Wang, Beijing (CN); Ni Yang, Beijing (CN); Yan Fang, Beijing (CN); Zhijian Qi, Beijing (CN); Yunze Li, Beijing (CN); Hengyi Xu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 712 days.

(21) Appl. No.: 16/083,243

(22) PCT Filed: Jan. 11, 2018

(86) PCT No.: PCT/CN2018/072215
§ 371 (c)(1),
(2) Date: Sep. 7, 2018

(87) PCT Pub. No.: WO2018/227962
PCT Pub. Date: Dec. 20, 2018

(65) Prior Publication Data
US 2021/0173297 A1    Jun. 10, 2021

(30) Foreign Application Priority Data

Jun. 14, 2017    (CN) .......................... 201710447407.2

(51) Int. Cl.
*G03F 1/38*    (2012.01)
*H01L 27/12*    (2006.01)

(52) U.S. Cl.
CPC ............ *G03F 1/38* (2013.01); *H01L 27/1222* (2013.01); *H01L 27/1288* (2013.01)

(58) Field of Classification Search
CPC .... G03F 1/38; H01L 27/1222; H01L 27/1288
See application file for complete search history.

(56) References Cited

U.S. PATENT DOCUMENTS

| 5,731,109 A | 3/1998 | Hwang |
| 2009/0109364 A1* | 4/2009 | Yang ........................ G03F 1/44 349/46 |

(Continued)

FOREIGN PATENT DOCUMENTS

| CN | 1096625 C | 12/2002 |
| CN | 102668050 A | 9/2012 |

(Continued)

OTHER PUBLICATIONS

First Office Action for Chinese Application No. 201710447407.2, dated Apr. 19, 2019, 6 Pages.

(Continued)

*Primary Examiner* — Anne M Hines
(74) *Attorney, Agent, or Firm* — Brooks Kushman P.C.

(57) ABSTRACT

The present disclosure provides a mask plate, a method for forming a via-hole, a method for forming a display substrate, the display substrate, and a display device. The mask plate is configured to form the via-hole in a layer, and includes a transparent pattern for the formation of the via-hole. The transparent pattern includes one or more curved edge, so the via-hole formed using the mask plate is provided with one or more curved edges at its bottom.

17 Claims, 5 Drawing Sheets

(56) References Cited

U.S. PATENT DOCUMENTS

2012/0228777 A1 9/2012 Yang et al.
2017/0123307 A1 5/2017 Xu et al.

FOREIGN PATENT DOCUMENTS

| CN | 103412462 A | 11/2013 |
| --- | --- | --- |
| CN | 103760748 A | 4/2014 |
| CN | 105159025 A | 12/2015 |
| CN | 206133181 U | 4/2017 |
| CN | 107247386 A | 10/2017 |
| JP | H03256393 A | 11/1991 |
| JP | 2012216715 A | 11/2012 |

OTHER PUBLICATIONS

International Search Report and Written Opinion for Application No. PCT/CN2018/072215, dated Apr. 13, 2018, 12 Pages.

\* cited by examiner

MASK PLATE, METHOD FOR FORMING VIA-HOLE, METHOD FOR FORMING DISPLAY SUBSTRATE, THE DISPLAY SUBSTRATE, AND DISPLAY DEVICE

CROSS-REFERENCE TO RELATED APPLICATION APPLICATIONS

This application is the U.S. national phase of PCT Application No. PCT/CN2018/072215 filed on Jan. 11, 2018, which claims priority to Chinese Patent Application No. 201710447407.2 filed on Jun. 14, 2017, which are incorporated herein by reference in their entireties.

TECHNICAL FIELD

The present disclosure relates to the field of display technology, in particular to a mask plate, a method for forming a via-hole, a method for forming a display substrate, the display substrate, and a display device.

BACKGROUND

During the design of a display substrate, in order to achieve electrical connection, different conductive layers (e.g., metal layers or indium tin oxide (ITO) layers) need to be connected to each other through via-holes. The connectivity of the different conductive layers and a size of a resultant contact resistance depend on a size and a shape of each via-hole.

Usually, the via-hole is of a rectangular shape, i.e., a cross section of the via-hole in a direction parallel to a plane where the display substrate is located is of a square or rectangular shape. When the via-hole is of a relatively small size, a contact area (an area of a contact portion between upper and lower conduction layers in the via-hole, i.e., an area of a bottom of the via-hole) is relatively small, so the resultant contact resistance is relatively large, and the insufficient connectivity occurs for the two conductive layers. Through increasing the size of the via-hole, it is able to effectively reduce the contact resistance and improve the connectivity. However, when the size of the via-hole is too large, an aperture ratio of each pixel may decrease, and Mura related to the diffusion of an alignment film (a polyimide (PI) film) may occur.

In addition, along with the increase in a resolution of the display product, a charging time period may decrease. Usually, a storage capacitance (Cst) needs to be reduced through a thicker insulation layer (passivation layer (PVX) or organic layer (ORG), so as to increase a charging rate. When the insulation layer in which the via-hole is arranged has a relatively large thickness, each of four side walls of the conventional rectangular via-hole may be provided with a relatively large gradient angle, and a very large segment difference may occur for the via-hole. At this time, when the upper conductive layer enters the via-hole, it may easily be broken, and thereby the connectivity may be adversely affected.

SUMMARY

In one aspect, the present disclosure provides in some embodiments a mask plate for forming a via-hole in a layer, including a transparent pattern for the formation of the via-hole. The transparent pattern includes one or more curved edges.

In a possible embodiment of the present disclosure, the transparent pattern includes one or more serrated or rippled edges.

In a possible embodiment of the present disclosure, the transparent patter is of a rectangular or circular shape.

In a possible embodiment of the present disclosure, the transparent pattern includes a body portion and a plurality of teeth arranged on the body portion.

In a possible embodiment of the present disclosure, a width of each tooth in a direction perpendicular to an extension direction of a tip of each tooth is reduced gradually from a first value greater than a resolution of an exposure machine to a second value smaller than the resolution of the exposure machine in the extension direction, and the exposure machine is configured to form the via-hole.

In a possible embodiment of the present disclosure, a gradient angle of the via-hole is smaller than or equal to 50°.

In another aspect, the present disclosure provides in some embodiments a method for forming a via-hole, including: providing a layer; and forming the via-hole in the layer using the above-mentioned mask plate.

In a possible embodiment of the present disclosure, when the layer is made of a photoresist material, the forming the via-hole in the layer includes: placing the mask plate above the layer; and exposing the layer so as to form the via-hole in the layer.

In a possible embodiment of the present disclosure, when the layer is not made of the photoresist material, the forming the via-hole in the layer includes: forming a photoresist layer on the layer; placing the mask plate above the photoresist layer; exposing and developing the photoresist layer, so as to form a photoresist reserved region and a photoresist unreserved region; and etching a portion of the layer at the photoresist unreserved region, so as to form the via-hole in the layer.

In yet another aspect, the present disclosure provides in some embodiments a method for forming a display substrate, including forming the via-hole in a layer using the above-mentioned method.

In still yet another aspect, the present disclosure provides in some embodiments a display substrate, including a layer and a via-hole formed in the layer. A cross section of the via-hole has one or more curved edges.

In a possible embodiment of the present disclosure, the cross section of the via-hole has one or more rippled edges.

In a possible embodiment of the present disclosure, the layer includes at least one insulation layer.

In a possible embodiment of the present disclosure, when the at least one insulation layer is a PVX layer and the via-hole is of a square shape, a length of each side of the via-hole is smaller than 10 µm.

In a possible embodiment of the present disclosure, when the at least one insulation layer is a PVX layer and the via-hole is of a circular shape, a diameter of the via-hole is smaller than 10 µm.

In a possible embodiment of the present disclosure, when the at least one insulation layer is an ORG layer and the via-hole is of a square shape, a length of each side of the via-hole is smaller than 25 µm.

In a possible embodiment of the present disclosure, when the at least one insulation layer is an ORG layer and the via-hole is of a circular shape, a diameter of the via-hole is smaller than 25 µm.

In still yet another aspect, the present disclosure provides in some embodiments a display device including the above-mentioned display substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1:
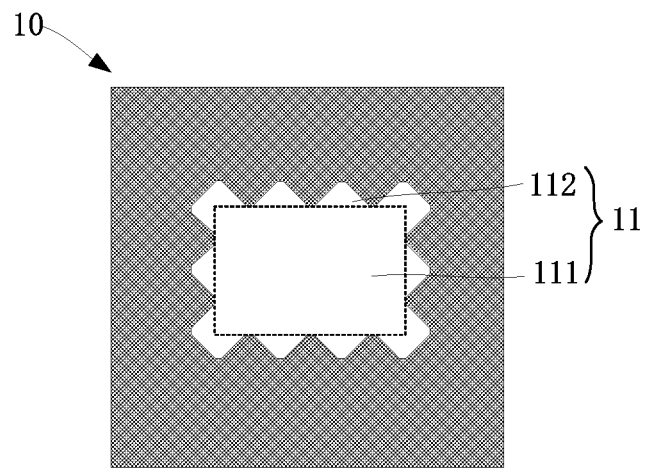
FIG. 1 is a schematic view showing a mask plate according to a first embodiment of the present disclosure.

For a conventional display substrate, when an upper conductive layer is electrically connected to a lower conductive layer through a via-hole, a contact area is small, so a resultant contact resistance is large. In addition, due to a large segment difference of the via-hole, the connectivity of the two conductive layers may be adversely affected. An object of the present disclosure is to provide a mask plate, a method for forming a via-hole, a method for forming a display substrate, the display substrate and a display device, so as to increase the contact area between the upper and lower conductive layers electrically connected to each other through the via-hole, reduce the contact resistance and improve the connectivity.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The present disclosure provides in some embodiments a mask plate for forming a via-hole in a layer. The mask plate includes a transparent pattern for forming the via-hole, and the transparent pattern includes one or more curved edges.

According to the embodiments of the present disclosure, the transparent pattern of the mask plate includes one or more curved edges, so the via-hole formed through the mask plate has one or more curved edges at its bottom. At this time, it is able to increase a length of a boundary between an upper conductive layer and a lower conductive layer electrically connected to each other through the via-hole, thereby to reduce a resultant contact resistance between the upper and lower conductive layers, and improve the connectivity. In addition, during the formation of the via-hole through an exposing process, a small amount of light is allowed to pass through the transparent pattern at its edges, so merely a portion of the layer corresponding to the edges is etched off, and a gradient angle of an inner wall of the via-hole is relatively small. As a result, it is able to reduce the segment difference of the via-hole and prevent a portion of the upper conductive layer in the via-hole from being broken, thereby to further improve the connectivity.

In a possible embodiment of the present disclosure, the transparent pattern includes one or more serrated or rippled edges. For the one or more edges, such parameters as the number of teeth or ripples, a size of each tooth or ripple, and an interval between two adjacent teeth or ripples may be set in accordance with the practical need.

In a possible embodiment of the present disclosure, the transparent patter is of a rectangular, e.g., square or rectangular, or circular shape. When the transparent pattern is of the rectangular shape, at least one of four edges may be of serrated or rippled shape.

The structure of the mask plate will be described hereinafter in conjunction with the drawings and embodiments.

As shown in FIG. 1, in a first embodiment, the mask plate 10 includes the transparent pattern 11 for forming the via-hole. The transparent pattern 11 is of a rectangular shape, and four sides of the transparent pattern 11 are each of a serrated shape.

Figure 2:
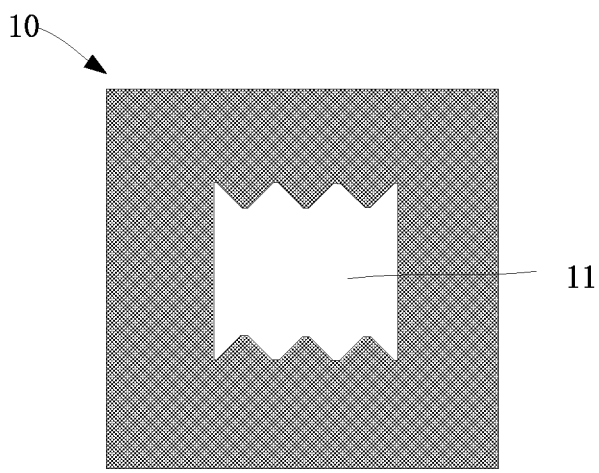
FIG. 2 is a schematic view showing the mask plate according to a second embodiment of the present disclosure.

As shown in FIG. 2, in a second embodiment, the mask plate 10 includes the transparent pattern 11 for forming the via-hole. The transparent pattern 11 is of a rectangular shape, and two opposite sides of the transparent pattern 11 are each of a serrated shape.

Figure 3:
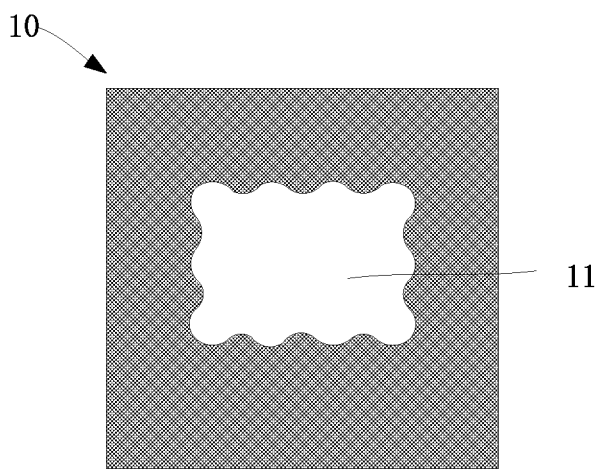
FIG. 3 is a schematic view showing the mask plate according to a third embodiment of the present disclosure.

As shown in FIG. 3, in a third embodiment, the mask plate 10 includes the transparent pattern 11 for forming the via-hole. The transparent pattern 11 is of a rectangular shape, and four sides of the transparent pattern 11 are each of a rippled shape (i.e., each side consists of a plurality of consecutive arcs).

Figure 4:
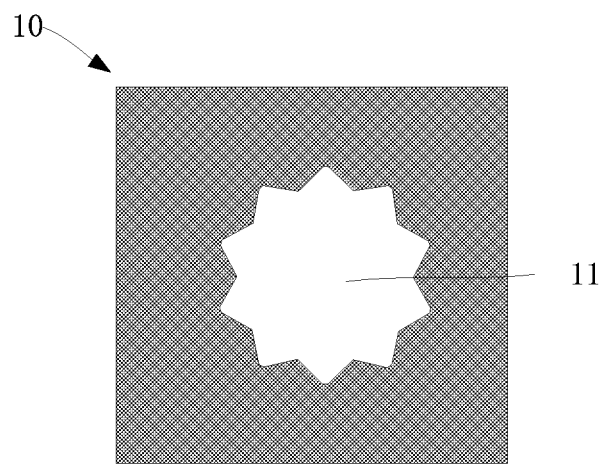
FIG. 4 is a schematic view showing the mask plate according to a fourth embodiment of the present disclosure.

As shown in FIG. 4, in a fourth embodiment, the mask plate 10 includes the transparent pattern 11 for forming the via-hole. The transparent pattern 11 is of a circular shape, and an edge of the transparent pattern 11 is of a serrated shape.

According to the embodiments of the present disclosure, the teeth or ripples on the one or more curved edges of the transparent pattern are arranged periodically, i.e., the one or more curved edges of the transparent pattern are presented in a regular curve. Of course, in some other embodiments of the present disclosure, the one or more curved edges of the transparent patter may also be presented in an irregular curve, as long as the resultant via-hole is provided with one or more curved edges at its bottom. At this time, it is able to increase the length of the boundary between the upper and lower conductive layers, thereby to reduce the contact resistance between the upper and lower conductive layers.

In the embodiments of the present disclosure, the transparent pattern is of a substantially rectangular or circular shape. Of course, in some other embodiments of the present disclosure, the transparent patter may also be of any other shapes, e.g., an elliptical shape.

In the embodiments of the present disclosure, the layer may include merely one layer, or a plurality of layers. Usually, the layer is an insulation layer. When the insulation layer is applied to a display substrate, it may include a gate insulation layer, a passivation (PVX) layer and/or an organic (ORG) layer. For example, the layer may include one or more of the gate insulation layer 103, the PVX layer 104 and the ORG layer 106 in FIG. 10.

When the insulation layer is the PVX layer, usually a size of the via-hole is relatively small. For example, when the via-hole is of a square shape, a length of each side is usually smaller than 10 μm, and when the via-hole is of a circular shape, a diameter of the via-hole is usually smaller than 10 μm. When the insulation layer is the ORG layer, the size of the via-hole is slightly larger. For example, when the via-hole is of the square shape, the length of each side is usually smaller than 25 μm, and when the via-hole is of the circular shape, the diameter of the via-hole is usually smaller than 25 μm. Through the small-size via-hole, it is able to improve an aperture ratio of a display product.

When the via-hole is formed in the display substrate, the upper conductive layer is usually an ITO layer, and the lower conductive layer is usually a metal layer. The metal layer has relatively small electrical resistivity (usually 0.1 Ω/□ or smaller), and the ITO layer has relatively large electrical resistivity (usually about 65 Ω/□). When a current flows through the ITO layer into the metal layer, generally it may not flow through a portion of the ITO layer in the middle of the via-hole, and instead, it may flow through a portion of the ITO layer at a boundary region of the via-hole, so the contact resistance depends on an area of the boundary region. In the embodiments of the present disclosure, through the above-mentioned mask plate, the via-hole formed in the layer has the one or more curved edges at its bottom, so it is able to increase a length of a boundary between the upper and lower conductive layers, thereby to reduce the contact resistance between the upper and lower conductive layers and improve the connectivity.

In the related art, the via-hole in the insulation layer of the display substrate usually has a relatively large segment difference. When the upper conductive layer enters the via-hole, it may be easily broken, and thereby the connectivity may be adversely affected, especially when the insulation layer is relatively thick (e.g., when the insulation layer is the ORG layer, its thickness is usually 2 μm or more). In the embodiments of the present disclosure, the transparent pattern includes the one or more curved edges, and during the formation of the via-hole through an exposing process, a small amount of light is allowed to pass through the transparent pattern at its edges, so merely a portion of the layer corresponding to the edges is etched off, and a gradient angle of an inner wall of the via-hole is relatively small. As a result, it is able to reduce the segment difference of the via-hole and prevent a portion of the upper conductive layer in the via-hole from being broken, thereby to further improve the connectivity.

Referring to FIG. 1, the transparent pattern 11 includes a body portion 111 and a plurality of teeth 112 arranged on the body portion 111 (in FIG. 1, the body portion 111 is separated from the teeth 112 through a dotted line. The body portion 111 is of a rectangular shape, while each tooth 112 is of a triangular shape. At a joint between two adjacent sides of the body portion 111, two teeth 112 partially overlap each other.

Figure 5:
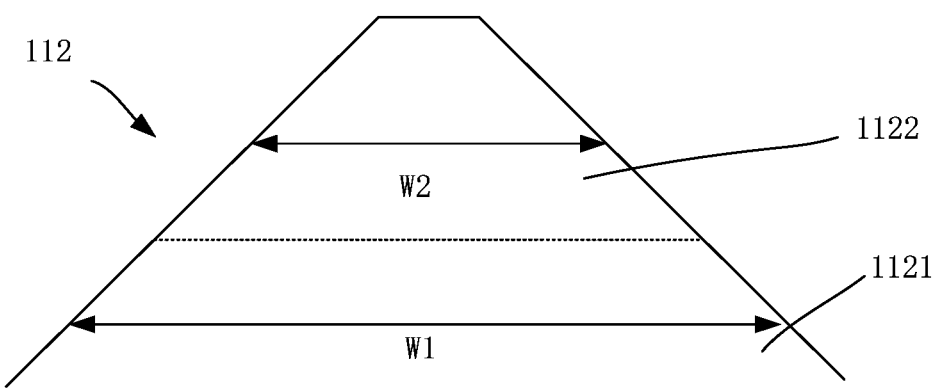
FIG. 5 is an enlarged view of a tooth of a transparent pattern in FIG. 1.

Referring to FIG. 5, a width of each tooth 112 in a direction perpendicular to an extension direction of a tip of each tooth 112 is reduced gradually from a first value greater than a resolution of an exposure machine to a second value smaller than the resolution of the exposure machine in the extension direction, and the exposure machine is configured to form the via-hole. In other words, each tooth 112 includes a first portion 1121 adjacent to the body portion and a second portion 1122 away from the body portion (the first portion 1121 is separated from the second portion 1122 through a dotted line in FIG. 5). The first portion 1121 has a width W1 greater than or equal to the resolution of the exposure machine, and the second portion 1122 has a width W2 smaller than the resolution of the exposure machine.

Figure 6:
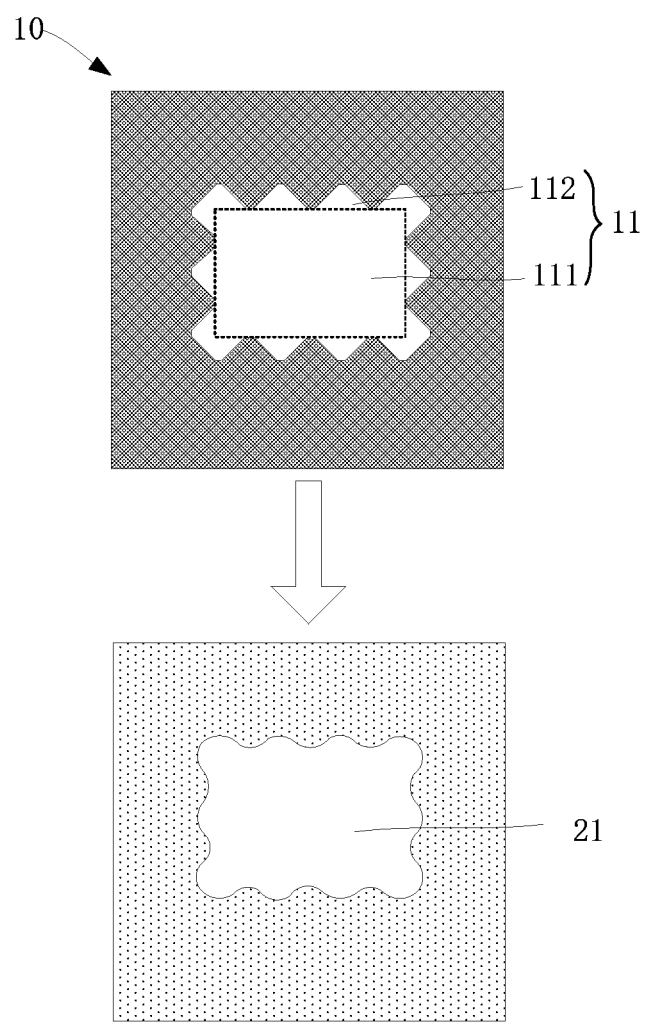
FIG. 6 is a schematic view showing the formation of a via-hole using the mask plate according to the first embodiment of the present disclosure.

In the embodiments of the present disclosure, during the formation of the via-hole, usually the exposing process needs to be adopted. The exposure machine for the exposing process has a certain resolution, e.g., 2 μm. A size of the body portion 111 of the transparent pattern 11 is far greater than or equal to the resolution of the exposure machine, so the body portion is capable of being completely exposed due to a sufficient amount of light, so as to form a corresponding pattern of the via-hole normally. When each tooth 112 includes the first portion 1121 having a width greater than or equal to the resolution of the exposure machine and the second portion 1122 having a width smaller than the resolution of the exposure machine, the first portion 1121 having the width greater than or equal to the resolution of the exposure machine may be exposed normally to form the pattern of the via-hole, while the second portion 1122 having the width smaller than the resolution of the exposure machine may not be exposed completely to form the pattern of the via-hole effectively. In other words, it is impossible to form the tip of each tooth completely. However, at this time, a part of the pattern of the via-hole may be formed due to the diffraction of the light, and finally the via-hole 21 having one or more rippled edges may be formed, as shown in FIG. 6.

In the embodiments of the present disclosure, the via-hole having the rippled edges may be formed through the resolution of the exposure machine and the diffraction of the light. On one hand, it is able to increase the length of the boundary between the upper conductive layer and the lower conductive layer, thereby to reduce the contact resistance. On the other hand, through controlling the amount of the light passing through the transparent pattern using the serrated structure, it is able to effectively reduce the gradient angle of each wall of the via-hole, and reduce the segment difference, thereby to prevent the upper conductive layer from being broken in the via-hole and improve the connectivity.

A principle of reducing the gradient angle of the inner wall of the via-hole and thereby reducing the segment difference through the one or more serrated edges will be described hereinafter.

Figure 8:
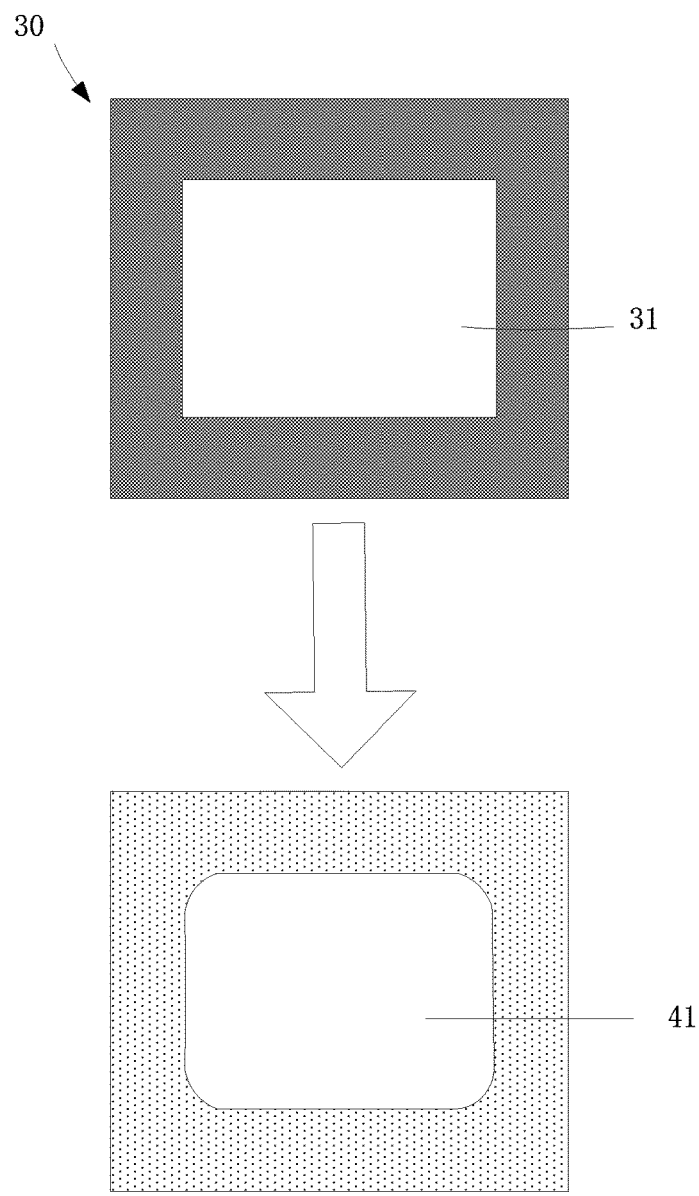
FIG. 8 is a schematic view showing the formation of the via-hole using a conventional mask plate.

As shown in FIG. 8, which shows the formation of the via-hole using the conventional mask plate, the transparent pattern 31 of the conventional mask plate 30 is of a rectangular shape, and its size is far greater than the resolution of the exposure machine. During the exposure, a sufficient amount of light may be provided, with a slightly smaller amount of light at corner portions, so as to form the via-hole 41 having a trapezoidal cross section. At this time, the gradient angle of each wall of the via-hole 41 is relatively large, and the segment different is relatively large too. Hence, the upper conductive layer may be easily broken in the via-hole, and thereby the connectivity may be adversely affected.

Figure 7:
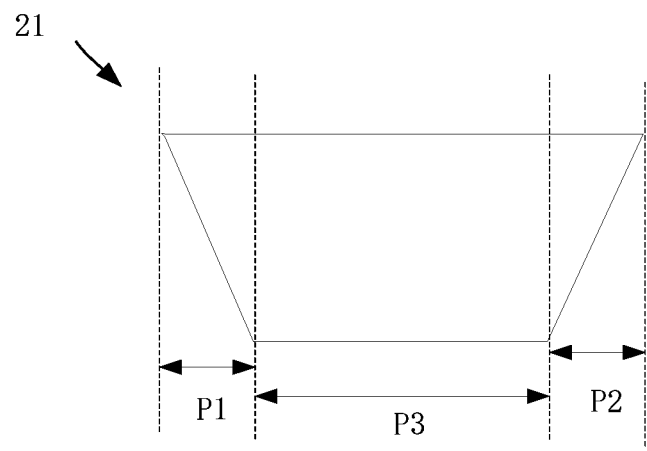
FIG. 7 is a sectional view of the via-hole in FIG. 6.

Referring to FIG. 6 which shows the formation of the via-hole using the mask plate in the first embodiment and FIG. 7 which is a sectional view of the via-hole in FIG. 6, the transparent pattern 11 of the mask plate 10 includes the body portion 111 and the teeth 112, so the size of the body portion 111 is far greater than the resolution of the exposure machine. During the exposure, a sufficient amount of light may pass through the body portion 111, so as to form a portion P3 of the via-hole 21. Each tooth 112 includes the portion having a width greater than or equal to the resolution of the exposure machine and the tip portion having a width smaller than the resolution of the exposure machine, so merely a small amount of light may pass through the tip portion due to the diffraction of light. At this time, it is able to merely etch off a portion of the insulation layer, so as to form portions P1 and P2 of the via-hole 21. Finally, the via-hole having a trapezoidal cross section may be formed. The gradient angle of each wall of the via-hole is relatively small, and the segment different is relatively small too. As a result, it is able to prevent the upper conductive layer from being broken in the via-hole, thereby to improve the connectivity.

The present disclosure further provides in some embodiments a method for forming a via-hole, including: providing a layer; and forming the via-hole in the layer using the above-mentioned mask plate.

According to the embodiments of the present disclosure, the transparent pattern of the mask plate includes one or more curved edges, so the via-hole formed through the mask plate has one or more curved edges at its bottom. At this time, it is able to increase a length of a boundary between an upper conductive layer and a lower conductive layer electrically connected to each other through the via-hole, thereby to reduce a resultant contact resistance between the upper and lower conductive layers, and improve the connectivity. In addition, during the formation of the via-hole through an exposing process, a small amount of light is allowed to pass through the transparent pattern at its edges, so merely a portion of the layer corresponding to the edges is etched off, and a gradient angle of an inner wall of the via-hole is relatively small. As a result, it is able to reduce the segment difference of the via-hole and prevent a portion of the upper conductive layer in the via-hole from being broken, thereby to further improve the connectivity.

In the embodiments of the present disclosure, the layer may include merely one layer, or a plurality of layers. Usually, the layer is an insulation layer. When the insulation layer is applied to a display substrate, it may include a gate insulation layer, a PVX layer and/or an ORG layer.

In a possible embodiment of the present disclosure, when the layer is made of a photoresist material, the forming the via-hole in the layer includes: placing the mask plate above the layer; and exposing the layer so as to form the via-hole in the layer.

In a possible embodiment of the present disclosure, when the layer is not made of the photoresist material, the forming the via-hole in the layer includes: forming a photoresist layer on the layer; placing the mask plate above the photoresist layer; exposing and developing the photoresist layer, so as to form a photoresist reserved region and a photoresist unreserved region; and etching a portion of the layer at the photoresist unreserved region, so as to form the via-hole in the layer.

The present disclosure further provides in some embodiments a method for forming a display substrate, including forming a via-hole in a layer using the above-mentioned method.

Based on an identical inventive concept, the present disclosure further provides in some embodiments a display substrate, including a layer and a via-hole formed in the layer. A cross section of the via-hole has one or more curved edges.

In a possible embodiment of the present disclosure, the cross section of the via-hole has one or more rippled edges.

In the embodiments of the present disclosure, the display substrate may be an array substrate, e.g., a common array substrate, or a Color Filter on Array (COA) array substrate.

The present disclosure further provides in some embodiments a display device including the above-mentioned display substrate.

Figure 9:
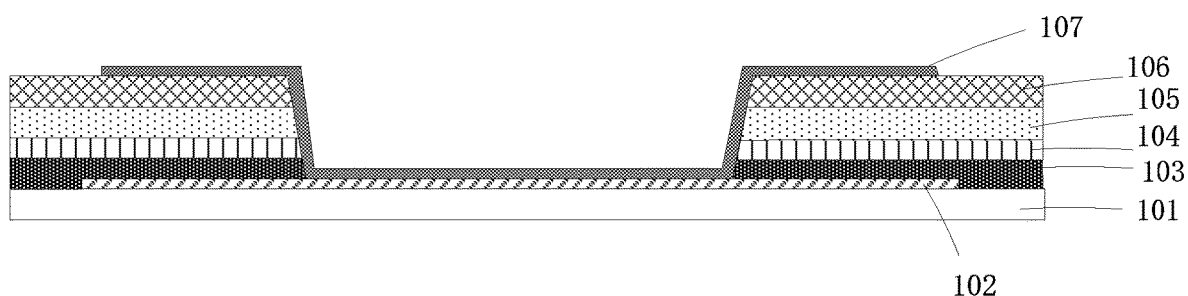
FIG. 9 is a schematic view showing a conventional display substrate.
Figure 10:
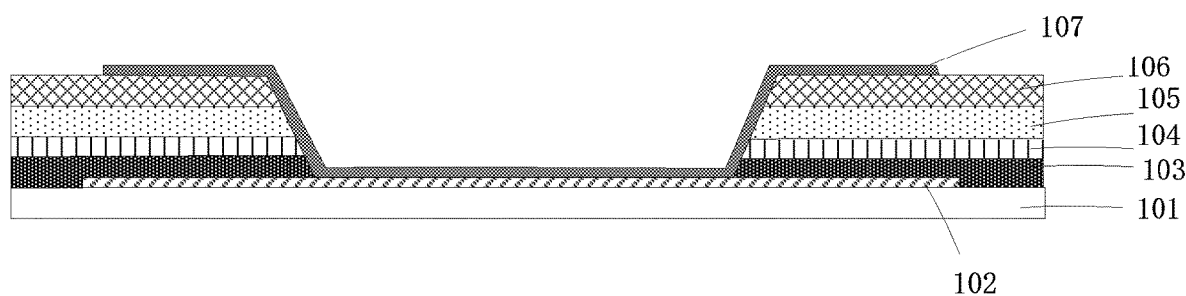
FIG. 10 is a schematic view showing a display substrate according to one embodiment of the present disclosure.

Referring to FIG. 9 which shows a conventional display substrate and FIG. 10 which shows the display substrate in the embodiments of the present disclosure, the display substrate includes a base substrate 101, a gate metal layer 102, a gate insulation layer 103, a PVX layer 104, a color filter layer 105, an ORG layer 106, and an ITO layer 107. The ITO layer 107 is connected to the gate metal layer 102 through a via-hole penetrating through the gate insulation layer 103, the PVX layer 104, the color filter layer 105 and the ORG layer 106. By comparing FIG. 9 with FIG. 10, the via-hole in the display substrate formed using the conventional mask plate has a relatively large gradient angle (usually greater than 60°, or even more than 70° when the via-hole is in the ORG layer), so the ITO layer 107 may be easily broken in the via-hole. However, the via-hole formed using the mask plate in the embodiments of the present disclosure has an obviously small gradient angle (small than 50°), so it is able to prevent the ITO layer 107 from being broken easily in the via-hole, thereby to improve the connectivity.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Each embodiment in the present disclosure may be described in the form of a certain range. It should be appreciated that, the description in the form of the certain range is merely for convenience and clarification, but shall not be construed as limiting the scope of the present disclosure. Hence, the range shall be deemed as including all possible sub-ranges as well as any single value within the range, regardless of a width of the range. For example, the description "within the range of 1 to 6: shall be deemed as including such sub-ranges as "the range of 1 to 3", "the range of 1 to 4", "the range of 2 to 4", "the range of 2 to 6", "the range of 3 to 6", and any single value within the range, e.g., 1, 2, 3, 4, 5 and 6.

In the case that a specific numerical range is specified, it shall include all numbers (fractional or integral numbers) within the numerical range. Such expressions as "within the range of a first number to a second number" or "ranging from a first number to a second number" are intended to include the first number, the second number and any fractional and integral numbers between the first number and the second number.

It should be further appreciated that, for clarification, some features are separately described in several embodiments, but they may also be combined in a single embodiment. Also, the features described in a single embodiment may also be described separately, or in any appropriate combinations, in the other embodiments. Some features described in a certain embodiment shall not be deemed as necessary features for the embodiment, unless the embodiment is unfeasible without these features.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A mask plate for forming a via-hole in a layer, comprising a transparent pattern for the formation of the via-hole, wherein the transparent pattern comprises one or more curved edges,
   wherein the transparent pattern comprises one or more serrated or rippled edges,
   wherein the transparent pattern comprises a body portion and a plurality of teeth arranged on the body portion,
   wherein a width of each tooth in a direction perpendicular to an extension direction of a tip of each tooth is reduced gradually from a first value greater than a resolution of an exposure machine to a second value smaller than the resolution of the exposure machine in the extension direction, and the exposure machine is configured to form the via-hole.

2. The mask plate according to claim 1, wherein the transparent pattern is approximately of a square or circular shape.

3. The mask plate according to claim 1, wherein a gradient angle of the via-hole is smaller than or equal to 50°.

4. A method for forming a via-hole, comprising:
   providing a layer; and
   forming the via-hole in the layer using a mask plate for forming the via-hole in the layer, comprising a transparent pattern for the formation of the via-hole, wherein the transparent pattern comprises one or more curved edges,
   wherein the transparent pattern comprises one or more serrated or rippled edges,
   wherein the transparent pattern comprises a body portion and a plurality of teeth arranged on the body portion,
   wherein a width of each tooth in a direction perpendicular to an extension direction of a tip of each tooth is reduced gradually from a first value greater than a resolution of an exposure machine to a second value smaller than the resolution of the exposure machine in the extension direction, and the exposure machine is configured to form the via-hole.

5. The method according to claim 4, wherein when the layer is made of a photoresist material, the forming the via-hole in the layer comprises: placing the mask plate above the layer; and exposing the layer so as to form the via-hole in the layer.

6. The method according to claim 4, wherein when the layer is not made of the photoresist material, the forming the via-hole in the layer comprises: forming a photoresist layer on the layer; placing the mask plate above the photoresist layer; exposing and developing the photoresist layer, so as to form a photoresist reserved region and a photoresist unreserved region; and etching a portion of the layer at the photoresist unreserved region, so as to form the via-hole in the layer.

7. A method for forming a display substrate, comprising forming a via-hole in a layer of the display substrate using the method according to claim 4.

8. A display substrate, comprising a layer and a via-hole formed in the layer using the method according to claim 4, wherein a cross section of the via-hole has one or more curved edges.

9. The display substrate according to claim 8, wherein the cross section of the via-hole has one or more rippled edges.

10. The display substrate according to claim 8, wherein the layer comprises at least one insulation layer.

11. The display substrate according to claim 10, wherein when the at least one insulation layer is a passivation (PVX) layer and the via-hole is of a square shape, a length of each side of the via-hole is smaller than 10 μm.

12. The display substrate according to claim 10, wherein when the at least one insulation layer is a PVX layer and the via-hole is of a circular shape, a diameter of the via-hole is smaller than 10 μm.

13. The display substrate according to claim 10, wherein when the at least one insulation layer is an organic (ORG) layer and the via-hole is of a square shape, a length of each side of the via-hole is smaller than 25 μm.

14. The display substrate according to claim 10, wherein when the at least one insulation layer is an ORG layer and the via-hole is of a circular shape, a diameter of the via-hole is smaller than 25 μm.

15. A display device, comprising the display substrate according to claim 8.

16. The display device according to claim 15, wherein the display substrate is an array substrate.

17. The display device according to claim 16, wherein the array substrate is a Color Filter on Array (COA) array substrate.

* * * * *